(12) United States Patent
Bradfield

(10) Patent No.: US 6,707,691 B2
(45) Date of Patent: Mar. 16, 2004

(54) COMPACT RECTIFIER BRIDGE AND METHOD FOR MANUFACTURING THE SAME

(75) Inventor: Michael Duane Bradfield, Anderson, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/124,127

(22) Filed: Apr. 17, 2002

(65) Prior Publication Data
US 2003/0198068 A1 Oct. 23, 2003

(51) Int. Cl.[7] .......................... H02M 1/00; H02K 11/00; H05K 7/20
(52) U.S. Cl. ...................... 363/145; 361/704; 310/68 D
(58) Field of Search .......................... 363/145, 141, 363/144; 361/704, 705, 707; 310/68 D, 64, 686, 89, 91

(56) References Cited

U.S. PATENT DOCUMENTS

| | | | |
|---|---|---|---|
| 3,684,944 A | 8/1972 | Evgrafov et al. | 321/8 |
| 4,606,000 A | 8/1986 | Steele et al. | 363/145 |
| 4,841,182 A | 6/1989 | Tsuchiya et al. | 310/68 D |
| 4,952,829 A | 8/1990 | Armbruster et al. | 310/68 D |
| 5,258,673 A | 11/1993 | Gotoh | 310/68 D |
| 5,453,648 A | 9/1995 | Bradfield | 310/71 |
| 5,640,062 A | 6/1997 | Yockey | 310/68 D |
| 5,646,838 A | 7/1997 | Keidar et al. | 363/145 |
| 5,712,517 A | 1/1998 | Schmidt et al. | 310/45 |
| 5,729,063 A * | 3/1998 | Adachi et al. | 310/68 D |
| 5,812,388 A | 9/1998 | Keidar et al. | 363/145 |
| 6,124,655 A | 9/2000 | Jeske | 310/71 |
| 6,205,024 B1 * | 3/2001 | Shih et al. | 361/704 |
| 6,275,404 B1 | 8/2001 | Shichijyo et al. | 363/145 |
| 6,285,100 B1 | 9/2001 | Pfjueger et al. | 310/68 D |
| 6,501,172 B1 * | 12/2002 | Fukada et al. | 257/707 |

* cited by examiner

Primary Examiner—Rajnikant B. Patel
(74) Attorney, Agent, or Firm—Jimmy L. Funke

(57) ABSTRACT

A compact rectifier bridge for an air-cooled generator is disclosed. The rectifier bridge comprises a first electrically conductive heat sink to which a first diode is electrically coupled, a second electrically conductive heat sink axially spaced from the first heat sink, and to which a second diode is electrically coupled. The rectifier additionally comprises a diode terminal assembly sandwiched between the first and second heat sinks, and having a lead terminal for electrically connecting leads from the first and second diodes. The lead terminal is radially spaced from said first and second diodes. The rectifier bridge may further comprise an output terminal structure on the first heat sink comprising a compressible tower disposed about an output terminal stud and a cavity in the surface of said heat sink for receiving the output terminal. Also disclosed is a method for manufacturing the compact rectifier bridge.

24 Claims, 7 Drawing Sheets

COMPACT RECTIFIER BRIDGE AND METHOD FOR MANUFACTURING THE SAME

BACKGROUND OF THE INVENTION

1. Technical Field

The present invention relates to a rectifier bridge assembly for an air-cooled generator and a method of producing such a rectifier bridge.

2. Description of the Related Art

It is known that excessive heat accumulation can cause the rectifier of an automotive generator to malfunction. Moreover, increased underhood ambients, coupled with increased generator output have led to growing demands on the heat sink capability of automobile generators. In addition to thermal difficulties, vibration that occurs during the usage of automobile generators can cause fatigue failures in terminal assemblies of bridge rectifiers.

Furthermore, usage also often loosens the B+ cable connection to the battery output terminal of a rectifier bridge. Typically, such a connection comprises a ring terminal for the B+ cable secured through a threaded fastener attached to the positive heat sink. During field usage, the connection may loosen due to relaxation of the clamp force.

Conventional bridge rectifiers for automobile generators are known, as seen by reference to U.S. Pat. No. 5,640,062 issued to Yockey. Yockey discloses an alternator assembly with an internal bridge rectifier. The bridge rectifier disclosed by Yockey includes a plurality of positive diodes, a plurality of negative diodes, and a plurality of conductive traces to electrically connect pairs of positive and negative diodes to stator lead wires, or stator phase windings. Yockey further discloses solder pads within the conductive traces to receive anodes of positive diodes, cathodes of negative diodes and stator lead wires. In addition, Yockey discloses a battery terminal that is electrically connected to and extends out from the bridge rectifier.

The arrangement of solder pads in the bridge rectifier disclosed by Yockey radially and angularly increases the size of the bridge rectifier. Moreover, the rectifier bridge disclosed by Yockey may not adequately retain the B+ cable connection to the output terminal.

In addition, present production heat sinks are typically stamped aluminum plates with a variety of holes and opening configurations. These openings permit airflow through the rectifier and at the same time provide surface area for convective heat transfer. However, because of the limitations of a flat, stamped heat sink, the amount of surface area that can be realized is limited. Alternatively, if sufficient surface area is provided, then the heat sink itself can be too large to fit within the room available, either in a radial or axial direction.

There is therefore a need to provide an improved rectifier bridge that overcomes one or more of the above identified shortcomings.

SUMMARY OF THE INVENTION

The present invention provides an improved compact rectifier bridge for an alternating current generator. A compact rectifier bridge in accordance with the present invention comprises a first electrically conductive heat sink with a first diode electrically coupled to the first heat sink. The first diode has an electrical lead extending from the diode. The invention further comprises a second electrically conductive heat sink axially spaced from the first heat sink, and a second diode electrically coupled to the second heat sink. The first and second diodes have an electrical lead extending from each diode. The invention further comprises a diode terminal assembly sandwiched between the first and second heat sinks for electrically insulating the first and second heat sinks from each other. The diode terminal assembly has a lead terminal for electrically connecting leads from the first and second diodes. The lead terminal is radially spaced from the first and second diodes.

The present invention may also comprise an output terminal structure, associated with the first heat sink, for supporting an alternator output terminal. The output terminal structure may comprise a compressible tower disposed about an output terminal stud and a cavity in the surface of the first heat sink for receiving the output terminal stud. The walls of the cavity may rotationally secure the output terminal stud.

The present invention also provides a method of manufacturing a compact rectifier bridge. The method comprises the steps of providing a first electrically conductive heat sink; electrically coupling a first diode to the first heat sink; providing a second electrically conductive heat sink axially spaced from the first heat sink; electrically coupling a second diode to the second heat sink; sandwiching a diode terminal assembly having a lead terminal between the first and second heat sinks, the diode terminal having a lead terminal; and electrically coupling the leads of the first and second diodes to the lead terminal, the lead terminal, which is radially positioned relative to the first and second diodes.

One object of the present invention is to overcome the foregoing problems and/or to satisfy at least one of the aforementioned needs. One advantage of the present invention is that it provides a rectifier bridge with a high ambient temperature capability in a compact assembly. The invention achieves this through the layout geometry of the rectifier bridge which affords a relatively small package size, both with respect to height and angular span, and low thermal resistance. In particular, opposing sets of press-fit positive and negative diodes may be stacked in line and facing each other. For rectifier bridges that require, for example, 12 diodes the diode arrangement of the present invention frees up angular space, as each diode set does not require as much angular arc in the layout. Additionally, the layout geometry of the present invention shortens the overall axial length of the rectifier bridge assembly due to a radial connection of the diodes instead of an axial connection. With the diode pair facing each other, the diode leads are bent and brought out in a substantially radial manner where they are welded to the terminal assembly. In contrast, in conventional rectifier assemblies, diodes project axially from the back surface of a heat sink to connect to the terminal assembly. Such a configuration requires additional axial length in the assembly due to the distance required for the typical terminal connection.

In addition, the terminal assembly of the present invention consists of an overmolded copper strap disposed within a plastic structure. This structure is sandwiched between the positive and negative heat sinks. The terminal assembly is clamped in place by axially projecting spacers from the positive and negative heat sinks. Through this configuration, the terminal assembly of the present invention is held rigidly and securely to resist vibration induced fatigue failures. Moreover, the configuration of the terminal assembly in the present invention provides a convenient location for the diode leads from a pair of positive and negative diodes that straddle the insert molded terminal assembly. As a welded joint, the leads themselves serve as a natural concentration point for welding, as opposed to welding a lead to a flat plate. Furthermore, since both leads must be in intimate electrical contact with the strap for welding to occur, the invention provides for an additional degree of error proofing to the connection of the leads to the terminal assembly.

The present invention further provides an improved B+ connection. The invention provides a cast tower around the B+ output terminal. In the invention disclosed, the B+ output terminal is a bolt that is retained by a cavity that is molded in the underside of the positive heat sink of the rectifier. Advantageously, the cast tower acts like a mechanical spring when the B+ cable is connected. When the B+ connection is tightened, the tower compresses. As a result, although during field usage actions such as creep, thermal expansions and contractions, vibration, and the like may occur, the tower acts like a spring and provides adequate clamp force so that good electrical contact is maintained.

BRIEF DESCRIPTION OF THE DRAWINGS

The present invention will now be described by way of example, with reference to the accompanying drawings, in which.

DETAILED DESCRIPTION OF THE PREFERRED EMBODIMENTS

Figure 1:
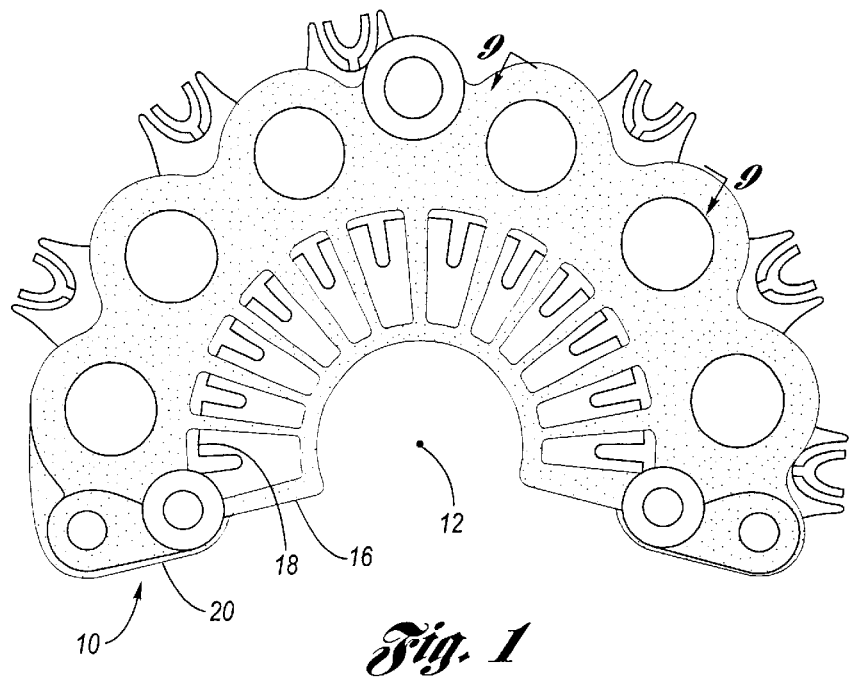
FIG. 1 is a top view of a rectifier bridge according to the present invention.

Referring now to the drawings wherein like reference numerals are used to identify identical components in the various views, FIG. 1 illustrates a compact rectifier bridge assembly 10 in accordance with one embodiment of the present invention. Rectifier 10 is provided to rectify the output voltage of an alternating current generator. It may be used as part of an air-cooled generator. Rectifier 10, however, can be used in other applications where similar benefits can be realized. The exemplary rectifier 10 may be used with a dual three-phase winding generator. Rectifier 10 is adapted to hold two sets of three (i.e., six) negative-side diodes and two sets of three (i.e., six) positive-side diodes. However, it will be apparent to those skilled in the art that the invention is not limited to such an arrangement. Rectifier 10 can be modified to hold more or fewer negative-side diodes and/or positive-side diodes depending upon the intended application of the rectifier assembly.

Rectifier 10 in the illustrated embodiment is generally arc shaped and, therefore, is associated with a main axis 12. Axis 12 is depicted in side views and cross-sectional views of the present invention, such as FIG. 3. While rectifier 10 is generally arc shaped so as to fit within an air-cooled automotive generator with a generally annular cross-sectional shape. It will be appreciated by those skilled in the art, however, that other shapes, including annular, will also suffice.

Figure 2:
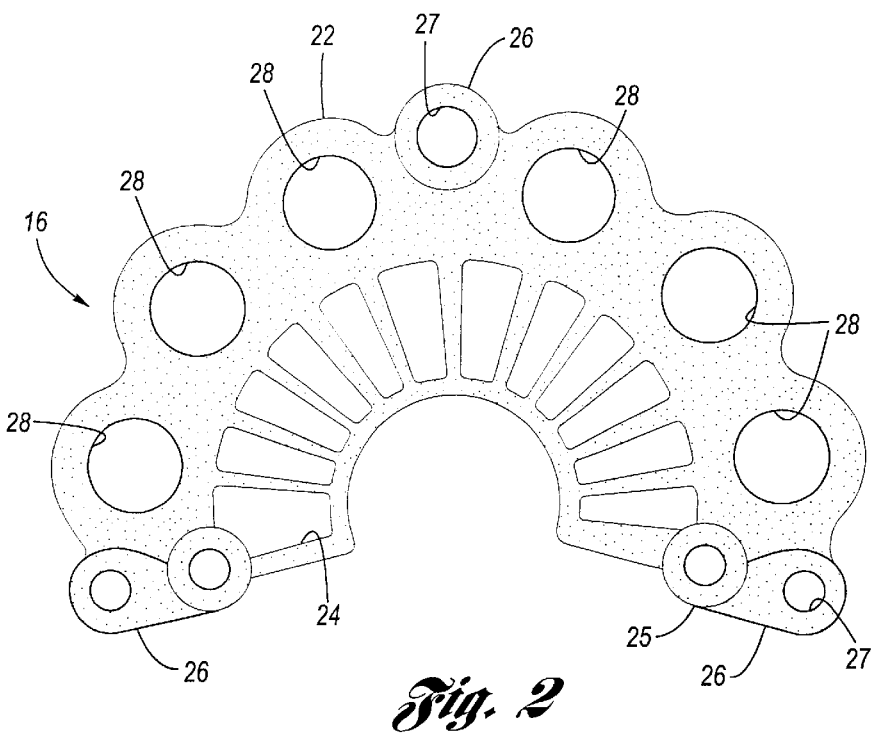
FIG. 2 is a top view of a positive diode heat sink of the rectifier bridge of FIG. 1.
Figure 3:
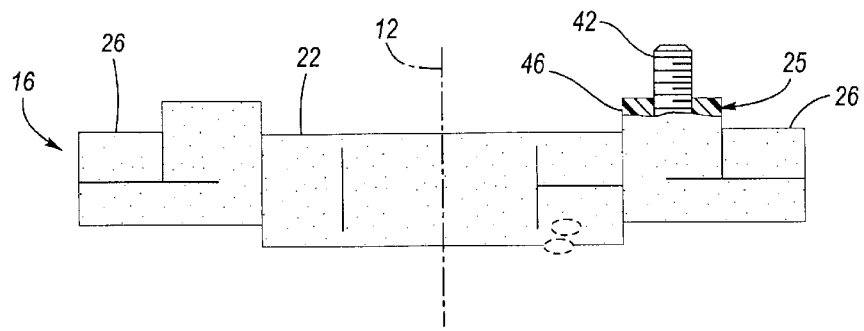
FIG. 3 is a side view of the positive diode heat sink of FIG. 2.
Figure 4:
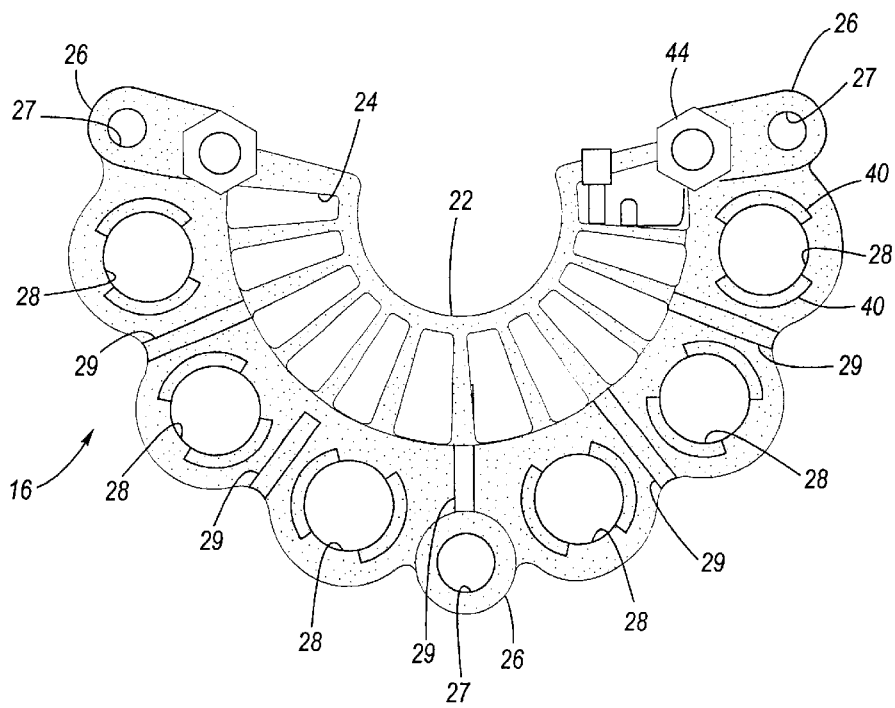
FIG. 4 is a bottom view of the positive diode heat sink of FIG. 2.

Rectifier 10 has a positive heat sink structure 16, a negative heat sink structure 18 that is axially spaced from the positive heat sink 16, and a terminal assembly 20 sandwiched between heat sinks 16, 18. FIGS. 2–4 depict positive heat sink 16. Positive heat sink 16 is generally arc shaped and may be made out of a thermally and electrically conductive material, such as aluminum. Positive heat sink 16 may include an arc shaped base 22, one or more cooling windows 24, an output terminal structure 25, one or more mounting bosses 26, one or more diode mounts 28, and one or more axial projecting spacers 29.

Cooling windows 24 are apertures in base 22. Windows 24 may be provided in base 22 by conventional manufacturing methods, including cutting, stamping, and casting. Windows 24 promote airflow through base 22 and other components of rectifier 10 and at the same time provide surface area for convective heat transfer. Airflow through windows 24 may be assisted by one or more fans within the same air-cooled generator as rectifier 10. Mounting bosses 26 may include holes 27 within base 22 and are provided to receive screws or other fasteners to mount rectifier 10 to an end-frame of an air-cooled alternating current generator (not shown).

Figure 10:
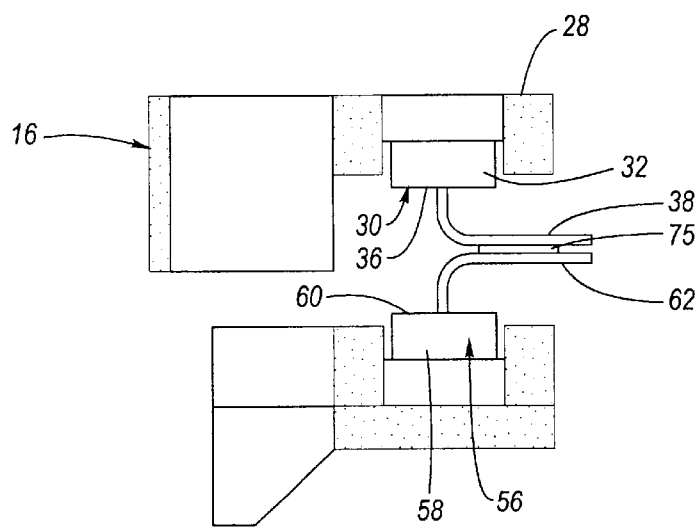
FIG. 10 is a sectional view of the rectifier bridge of FIG. 9 taken along lines 10—10.
Figure 11:
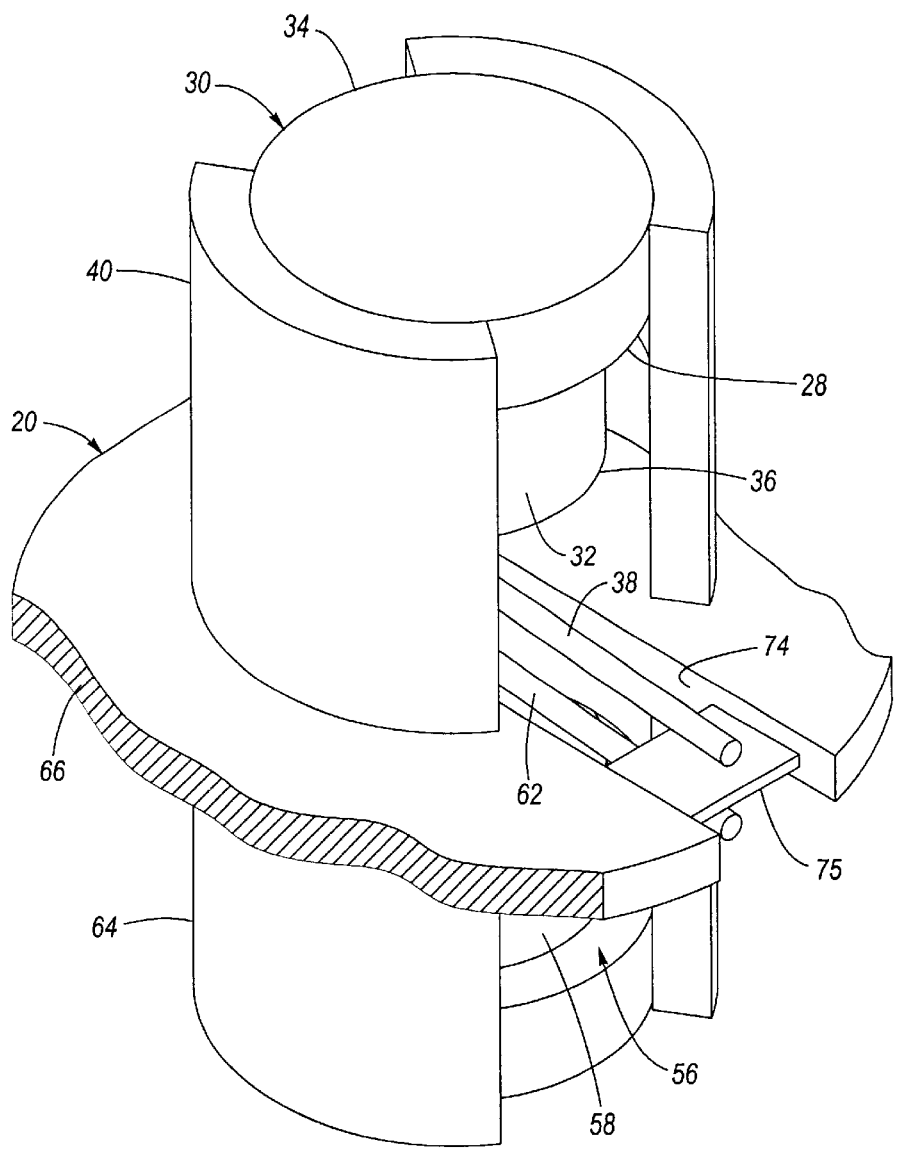
FIG. 11 is a perspective view of a diode connection of the rectifier bridge of FIG. 1.

Each diode mount 28 is adapted to retain a respective diode 30, as shown in FIGS. 10 and 11, in a thermally and electrically conductive manner. Heat from diode 30 is transferred to base 22 to provide the desired heat sink effect. Preferably, diode 30 is of the press-fit variety. Typically, such diodes have a conductive housing 32 with a closed end 34, an open end 36, and a diode terminal, or lead, 38 that extends out from open end 36. During installation, closed end 34 of diode 30 is press-fit into a correspondingly sized recess 28. The correspondingly sized recesses in this regard constitute the diode mounts 28. The diode material is contained within conductive housing 32.

Generally, press-fit diodes like diode 30, (as well as diode 56, as detailed below) include a conductive housing that serves as either the anode or the cathode of the diode. Projecting out from the diode, through its open end, is an electrical diode terminal, or lead, that defines the opposite terminal of the conductive housing. The electrical terminal, or lead, defines the cathode if the conductive housing serves as the anode, or defines the anode if the conductive housing serves as the cathode. The diode terminal, or lead, that projects out from the open end of the diode does not make electrical contact with the conductive housing.

In the depicted embodiment, press-fit diodes 30 mounted to heat sink 16 are commonly referred to as positive-side diodes. Such diodes 30 allow electrical current to flow into anode diode terminal, or lead, 38, through diode 30, and out from conductive housing 32, or the cathode of diode 30. Electrical current cannot flow in the reverse direction. As positive-side diodes 30 are mounted to heat sink 16, heat sink 16 is referred to as a positive heat sink since a positive direct voltage is developed on heat sink 16.

Preferably, diode mounts 28 of heat sink 16 are defined by a circumferential wall of a recess 28 or hole in base 22 of heat sink 16. Diode mounts 28 may additionally include axially projecting walls 40 which provide additional surface area for thermal conduction of heat away from diodes 30 to base 22. As shown, for example, in FIGS. 4 and 11, walls 40 axially project from the bottom side of base 22 toward terminal assembly 20. Walls 40 may be cast into base 22. Spacers 29 may also be cast into base 22 and may be angularly spaced about the bottom of base 22. Spacers 29 axially project from the bottom of base 22 toward terminal assembly 20. As the flow of electrical current heats diodes 30, diodes 30 transfer this heat to their surroundings. The heat from each diode 30 is therefore transferred to heat sink 16. Spacers 29 and walls 40 provide heat sink 16 with additional surface area to dissipate heat from diodes 30.

Referring to FIG. 3, output terminal structure 25 is provided to provide an outlet for the rectified electrical current of the generator to a storage device, such as an automobile battery. Output terminal structure 25 may include a terminal stud 42, a cavity 44, and an output terminal tower 46. Terminal stud 42 is electrically connected to positive heat sink 16. Terminal stud 42 has an axially extending threaded portion for receiving a ring terminal of a B+ cable, and for receiving a nut or other fastening member to secure the ring terminal to terminal stud 42. One end (not shown) of terminal stud 42 is hex shaped, and engages a corresponding hex shaped cavity 44. Cavity 44 is recessed in base 22 of heat sink 16. The hex shaped walls of cavity 44 rotationally secure output terminal 42. While cavity 44 is hex shaped, it will be appreciated by those skilled in the art that cavity 44 may be other shapes, such as octagonal, pentagonal, and square, that may also engage and rotationally secure terminal stud 42. Cavity 44 may be cast in base 22. Alternatively, cavity 44 may be drilled, stamped or cut into base 22. Terminal stud 42 may be at least partially disposed within output terminal tower 46.

Tower 46 axially extends from the top surface of base 22, and may be cast as a part of heat sink 16. Tower 46 includes a hollowed portion for receiving terminal stud 42. Tower 46 is compressible, and compresses when a B+ nut, or other fastening member, is secured to terminal stud 42 to connect a B+ cable ring member to terminal stud 42. The compression of tower 46 provides additional clamping force to securely clamp terminal structure 25 and the B+ connection. Tower 46, when compressed, acts as a spring to bias the ring member against the fastener.

Figure 5:
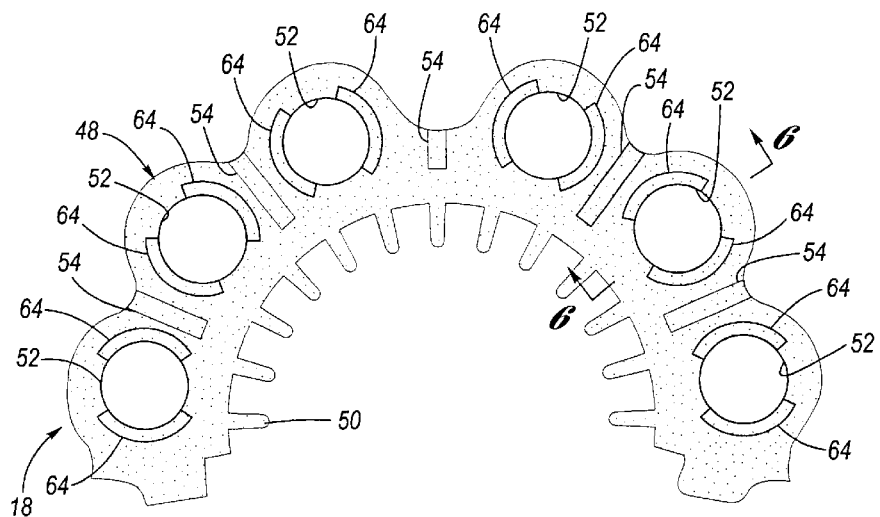
FIG. 5 is a top view of a negative diode heat sink of the rectifier bridge of FIG. 1.
Figure 6:
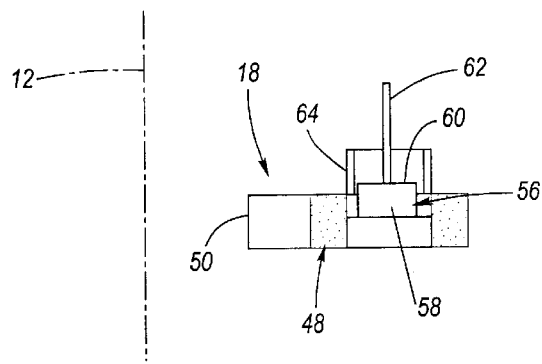
FIG. 6 is a sectional view of the negative diode heat sink of FIG. 5 taken along lines 6—6.

Referring now to FIGS. 5 and 6, negative heat sink 18 is shown. Negative heat sink 18 is generally arc shaped and may be made out of a thermally and electrically conductive material, such as aluminum. Negative heat sink 16 may include an arc shaped base 48, one or more cooling windows 50, one or more diode mounts 52, and one or more axial projecting spacers 54.

Cooling fins 50 are radial projections in base 48. Fins 50 may be provided in base 48 by conventional manufacturing methods, including cutting, stamping, and casting. Fins 50 provide additional surface area for convective heat transfer from base 48. As seen in FIG. 1, each fin 50 may be aligned with a respective cooling window 24 in positive heat sink 16 in the assembled rectifier 10. This minimizes the pressure drop of pulling air across the rectifier assembly and at the same time maximizes the convection coefficient for positive heats sink 16 and negative heat sink 18, which provides a significant thermal gain.

Each diode mount 52 is adapted to retain a respective diode 56 in a thermally and electrically conductive manner, as shown in FIGS. 6, 10 and 11 (but not present in FIG. 5). Heat from diode 56 is transferred to base 48 to provide the desired heat sink effect. Like diode 30, diode 56 is preferably of the press-fit variety. In particular, diode 56 has a conductive housing 58 with a closed end (not shown), an open end 60, and a diode terminal, or lead, 62 that extends out from open end 60. During installation, closed end of diode 56 is press-fit into a correspondingly sized recess 52. The correspondingly sized recesses in this regard constitute the diode mounts 52. The diode material is contained within conductive housing 58.

Press-fit diodes 56 mounted to heat sink 18 are commonly referred to as negative-side diodes. Negative-side diode 56 is electrically connected between the generator's electrical ground (e.g., its housing) and a respective stator phase winding so that electrical current can flow from the electrical ground into the respective stator phase winding, but not in the reverse direction.

Preferably, diode mounts 52 of heat sink 18 are defined by a circumferential wall of a recess 52 or aperture in base 48 of heat sink 18. Diode mounts 52 may additionally include axially projecting walls 64 for providing additional surface area for thermal conduction from diodes 56 to base 48. As shown, for example, in FIGS. 5, 6, and 11, walls 64 axially project from the top side of base 48 toward terminal assembly 20. Walls 64 may be cast into base 48.

Spacers 54 may also be cast into base 48 and may be angularly spaced about the top of base 48. Spacers 54 axially project from the top of base 48 toward terminal assembly 20.

As the flow of electrical current heats diodes 56, diodes 56 transfer this heat to their surroundings. The heat from each diode 56 is therefore transferred to heat sink 18. Spacers 54 and walls 64 provide heat sink 18 with additional surface area to dissipate heat from diodes 56.

It will be appreciated by those skilled in the art that an alternative to providing a separate negative heat sink structure 18 in rectifier assembly 10 may instead be to employ an end frame of the automobile generator or the generator housing itself as the negative heat sink. In particular, a slip ring end frame of an automobile generator may be cast with diode mounts for receiving diodes 56 and for providing heat sink effect to the diodes.

Figure 7:
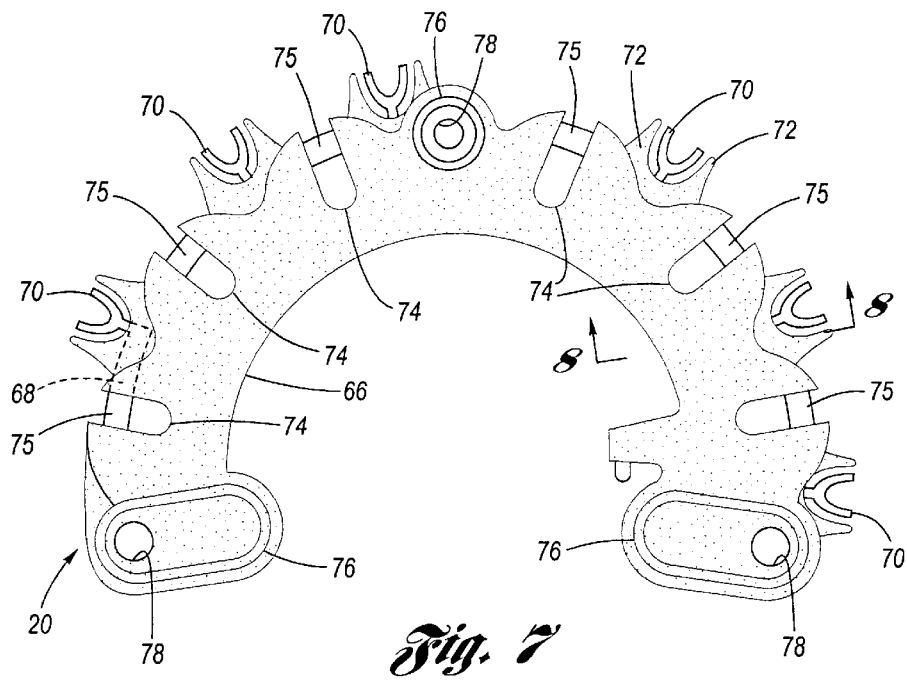
FIG. 7 is a top view of a terminal assembly of the rectifier bridge of FIG. 1.
Figure 8:
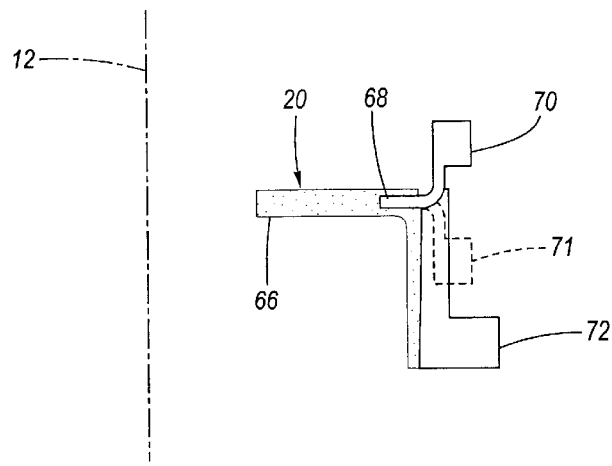
FIG. 8 is a sectional view of the terminal assembly of FIG. 7 taken along lines 8—8.

Referring now to FIGS. 7 and 8, terminal assembly 20 is shown. Terminal assembly 20 is provided for electrically connecting phase leads (not shown) from the stator to diodes 30, 56. Terminal assembly 20 is generally arc shaped and comprises a cover 66 made of an electrically insulating material, such as plastic. Cover 66 electrically insulates positive heat sink 16 from negative heat sink 18. Terminal assembly 20 may include terminal straps 68, crimping wings 70, channels 72, notches 74, raised spacers 76, and mounting holes 78. Embedded in plastic cover 66 are one or more insert molded electrically conductive terminal straps 68. Straps 68 are electrically insulated from each other. Preferably, the number of straps 68 correspond to the number of stator windings associated with the automobile generator. Each strap 68 is electrically connected to a crimping wing 70.

Crimping wings 70 serve as terminals for the ends of stator phase leads (not shown). Crimping wings 70 may project generally axially upward from terminal assembly 20 as shown in FIG. 8, or may project axially downward as shown by crimping wing 71. Straps 68 and crimping wings 70 are made of an electrically conductive metal, preferably copper. Each set of crimping wings 70 may be disposed within a channel 72. Channels 72 may be made from an electrically insulating material, such as plastic, and may be provided as a barrier to shield stator phase windings between heat sinks 16, 18. Channels 72 may further guide stator phase windings to crimping wings 70.

Notches 74 are provided in terminal assembly 66 to expose a portion of each strap 68 in order to provide a lead terminal 75. Lead terminals 75 provide a location to electrically connect a pair of diode leads 38, 62 from a positive side diode 30 and a negative side diode 56. Preferably, lead terminals 75 are located at a radially distant position, including at the outer radial edge, of terminal assembly 20.

Raised spacers 76 may be provided on the top surface of terminal assembly 20 to axially space positive heat sink 16 from terminal assembly 20, and in turn, space positive heat sink 16 from negative heat sink 18. This spacing avoids bridging as a result of salt or other forms of contamination, and provides additional isolation between heat sinks 16, 18.

Mounting holes 78 are provided in spacers 76 and align with mounting holes 27 of positive heat sink 16. Mounting screws (not shown) pass through both mounting holes 27 and 78 to mount rectifier 10 to an end frame of a generator.

Figure 9:
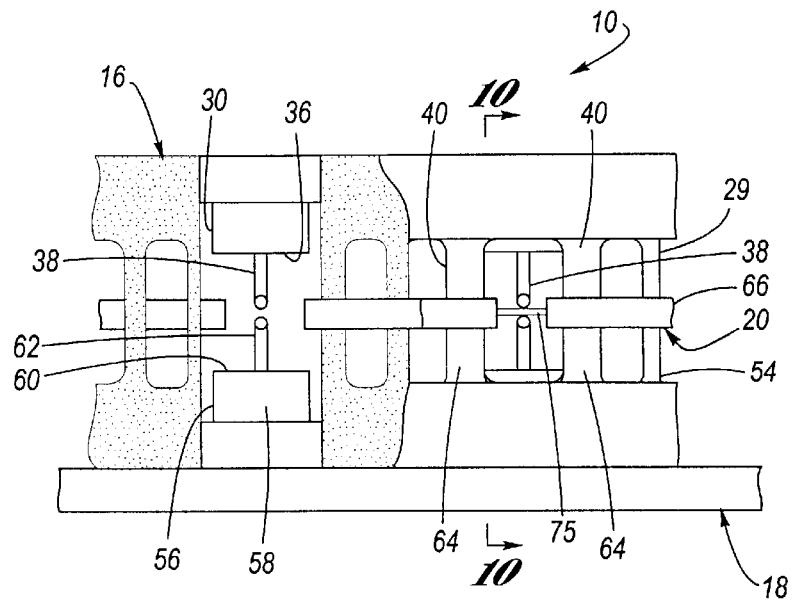
FIG. 9 is a sectional view of the rectifier bridge of FIG. 1 taken along lines 9—9.

Referring now to FIGS. 9, 10, and 11, various cross sectional views of the assembled rectifier 10 are shown. Terminal assembly 20 is sandwiched between positive heat sink 16 and negative heat sink 18. In particular, terminal assembly 20 is clamped between spacers 29 and walls 40 of positive heat sink 16 and spacers 54 and walls 64 of negative heat sink 18. In this manner, terminal assembly is held rigidly and securely to resist vibration induced fatigue failures.

Lead terminals 75 provide a location for diode leads 38, 62 to be electrically connected to the stator phase windings, which are electrically connected to crimping wings 70. In the preferred embodiment, a positive diode 30 and a negative diode 56 are diametrically opposingly positioned on each heat sink 16, 18. Such diodes form a diode pair. As shown best in FIG. 11, diode leads 38, 62 from each diode pair are bent in a substantially radial direction from diodes 30, 56, respectively, and are connected to lead terminal 75 of strap 68. In the preferred embodiment, diode leads 38, 62 are welded to lead terminal 75. However, it will be appreciated by those skilled in the art that such a connection may be made by soldering, brazing, or any other conventional method for joining metals. As a welded joint, leads 38, 62 themselves serve as a natural concentration point for welding, in contrast to welding a lead to a flat plate. Additionally, both wires must be in intimate electrical contact with lead terminal 75 for welding to occur, thereby providing a further degree of error proofing to the connection. This is in contrast with conventional lead terminal assemblies that consist of a copper strap bent over diode leads, in which an electrical welding circuit may be inadvertently completed without joining the diode leads.

Although not shown, each stator phase winding end, which is connected to respective terminals 70 and is in electrical contact with a respective lead terminal 75, has developed therein an alternating current (AC) voltage, as known. The above diode pair is operative to full wave rectify such AC voltage with an output on positive heat sink 16, specifically through output terminal structure 25.

Figure 12:
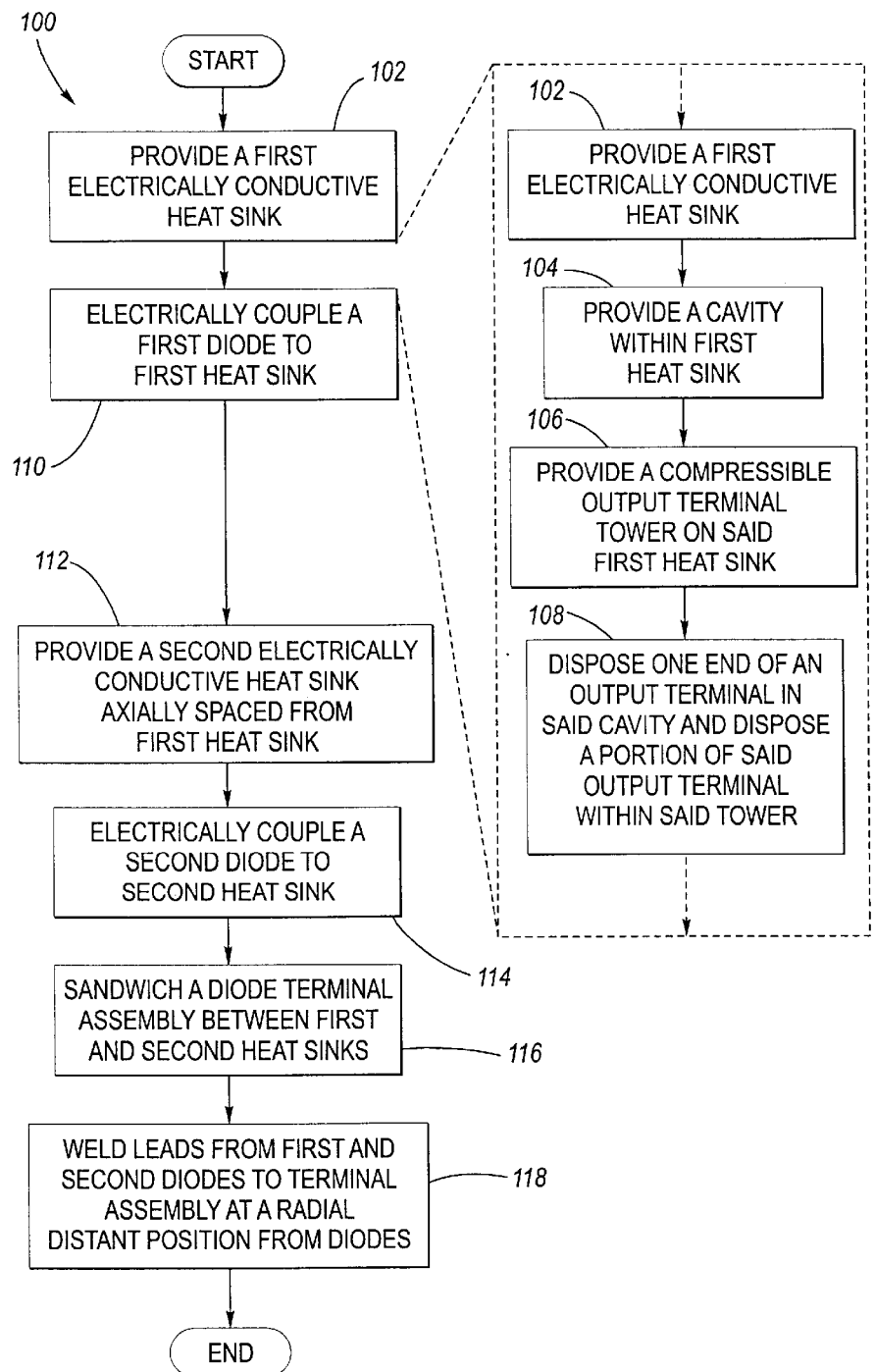
FIG. 12 is a flow diagram showing a method for manufacturing the rectifier bridge of FIG. 1.

The method for manufacturing rectifier 10 is shown in FIG. 12. Method 100 begins with the step of providing a first electrically conductive heat sink 102. In particular, this step further may include the steps of providing a cavity within the first heat sink 104, providing a cavity within the first heat sink 104; providing a compressible output terminal tower on the first heat sink 106; and disposing one end of an output terminal in the cavity, and disposing a portion of the output terminal in the tower 108. The step 106 of providing the tower may be provided by casting the tower into the first heat sink.

The method may further include the step of electrically coupling a first diode to the first heat sink 110. Next, the method may include the steps of providing a second electrically conductive heat sink, spaced axially apart from the first heat sink 112, and electrically coupling a second diode to the second heat sink 114. The method may further include the step of sandwiching a diode terminal assembly between the first and second heat sinks 116. Finally, the method may include the step of welding leads from the first and second diodes to the terminal assembly at a radially distant position from the diodes 118.

While the present invention has been described with reference to certain preferred embodiments and implementations, it is understood that various modifications and variations will no doubt occur to those skilled in the art to which this invention pertains. These and all other such variations which basically rely of the teachings through which this disclosure has advanced the art are properly considered within the scope of this invention.

I claim:

1. A rectifier unit for an alternating current generator having a main axis associated therewith, said rectifier unit comprising:

a first electrically conductive heat sink;

a first diode electrically coupled to said first heat sink, said diode having an electrical lead;

a second electrically conductive heat sink axially spaced from said first heat sink;

a second diode electrically coupled to said second heat sink, said second diode having an electrical lead; and a diode terminal assembly sandwiched between said first and second heat sinks for electrically insulating said first and second heat sinks from each other, said diode terminal assembly having a lead terminal for electrically connecting leads from said first and second diodes, wherein said lead terminal is radially spaced from said first and second diodes.

2. The rectifier unit of claim 1, wherein said first diode further comprises a first plurality of diodes, said second diode further comprises a second plurality of diodes, and said lead terminal further comprises a plurality of lead terminals.

3. The rectifier unit of claim 2, wherein each lead terminal is in electrical connection with a terminal for a stator phase winding of an electric generator.

4. The rectifier unit of claim 2, wherein each diode of said first plurality of diodes is diametrically opposed from a diode of said second plurality of diodes.

5. The rectifier unit of claim 4, wherein each diode of said first plurality of diodes is angularly spaced from another.

6. The rectifier unit of claim 2, wherein said first heat sink is arc shaped.

7. The rectifier unit of claim 2 wherein said first heat sink further comprises a first plurality of axially projecting spacers, said spacers for clampingly securing said sandwiched terminal assembly.

8. The rectifier unit of claim 7 wherein said second heat sink further comprises a second plurality of axially projecting spacers, said spacers for clampingly securing said sandwiched terminal assembly.

9. The rectifier unit of claim 2, wherein said diode terminal assembly comprises a copper strap disposed within a plastic housing.

10. The rectifier unit of claim 2, wherein said first heat sink further comprises a plurality of cooling windows and said second heat sink further comprises a plurality of radially extending cooling fins aligned with said plurality of cooling windows.

11. A rectifier unit for an alternating current generator having a main axis associated therewith, said rectifier unit comprising:

a first electrically conductive heat sink, said first heat sink having an output terminal structure, said output terminal structure comprising a compressible tower disposed about an output terminal stud, and a cavity in the surface of said heat sink for receiving said output terminal stud, wherein the walls of said cavity rotationally secure said output terminal stud;

a first diode electrically coupled to said first heat sink, said diode having an electrical lead;

a second electrically conductive heat sink axially spaced from said first heat sink;

a second diode electrically coupled to said second heat sink, said second diode having an electrical lead; and a diode terminal assembly sandwiched between said first and second heat sinks for electrically insulating said first and second heat sinks from each other, said diode terminal assembly having a lead terminal for electrically connecting leads from said first and second diodes, wherein said lead terminal is radially spaced from said first and second diodes.

12. The rectifier unit of claim 11, wherein said tower comprises a cast tower.

13. The rectifier unit of claim 11, wherein said first diode further comprises a plurality of diodes, said second diode further comprises a plurality of diodes, and said lead terminal further comprises a plurality of lead terminals.

14. The rectifier unit of claim 13, wherein each lead terminal is in electrical connection with a terminal for a stator phase winding of an electric generator.

15. The rectifier unit of claim 13, wherein each diode of said first plurality of diodes is diametrically opposed from a diode of said second plurality of diodes.

16. The rectifier unit of claim 15, wherein each diode of said first plurality of diodes is angularly spaced from another.

17. The rectifier unit of claim 13 wherein said first heat sink further comprises a first plurality of axially projecting spacers, said spacers for clampingly securing said sandwiched terminal assembly.

18. The rectifier unit of claim 17 wherein said second heat sink further comprises a second plurality of axially projecting spacers, said spacers for clampingly securing said sandwiched terminal assembly.

19. The rectifier unit of claim 13, wherein said first and second heat sinks are arc shaped.

20. The rectifier unit of claim 13, wherein said diode terminal assembly comprises a copper strap disposed within a plastic housing.

21. A method for manufacturing a rectifier unit for an alternating current generator having a main axis associated therewith, said method comprising:

providing a first electrically conductive heat sink;

electrically coupling a first diode to said first heat sink, said diode having an electrical lead;

providing a second electrically conductive heat sink axially spaced from said first heat sink;

electrically coupling a second diode to said second heat sink, said second diode having an electrical lead;

sandwiching a diode terminal assembly between said first and second heat sinks, said diode terminal having a lead terminal; and electrically coupling said leads of said first and second diodes to said lead terminal, said lead terminal positioned radially relative to said first and second diodes.

22. The method according to claim 21, wherein said diode terminal assembly comprises an electrically conductive strap disposed with a plastic housing, and wherein the step of electrically coupling said leads comprise welding the leads of said first and second diodes to said strap.

23. The method according to claim 22, wherein said leads radially extend to said strap.

24. The method of claim 21, further comprising the step of providing a cavity within said first heat sink, providing a compressible output terminal tower on said first heat sink, disposing one end of an output terminal in said cavity and disposing a portion of said output terminal within said tower.

* * * * *